United States Patent
Sharpes et al.

[11] Patent Number: 5,880,592
[45] Date of Patent: Mar. 9, 1999

[54] MODULAR DESIGN FOR AN IC TESTING BURN-IN OVEN

[75] Inventors: Michael J. Sharpes; Robert L. Totorica, both of Boise, Id.

[73] Assignee: Micron Technology, Inc., Boise, Id.

[21] Appl. No.: 91,953

[22] Filed: Jul. 15, 1993

[51] Int. Cl.[6] .................................................. G01R 31/00
[52] U.S. Cl. ............................................................ 324/760
[58] Field of Search ................................. 324/158 F, 760, 324/158.1; 307/149

[56] References Cited

U.S. PATENT DOCUMENTS

| | | | |
|---|---|---|---|
| 4,145,620 | 3/1979 | Dice | 307/149 |
| 4,468,616 | 8/1984 | Yoshizaki | 324/158 F |
| 4,866,714 | 9/1989 | Adams et al. | 371/22.1 |
| 4,900,948 | 2/1990 | Hamilton | 307/158.1 |
| 5,086,271 | 2/1992 | Haill et al. | 324/158 |
| 5,103,168 | 4/1992 | Fuoco | 324/158 F |

*Primary Examiner*—Vinh P. Nguyen

[57] ABSTRACT

A compact and modularly designed apparatus for testing and burning-in semiconductor devices comprises first and second power supplies and the use of direct current (DC) to DC converters. The first power supply provides high voltage low amperage power to drive the devices under test (DUTs), and the second power supply supplies 15 volts and 5 volts to drive the circuitry on the testing equipment. The high voltage and low amperage is supplied to slot boards, and the DC to DC converters alter the voltage and current to digital levels. Supplying high voltage and low amperage power through the system to a location electrically near the DUTs, then converting it with DC to DC converters to power the DUTs, allows for much smaller connectors and for a modularly designed burn-in oven.

16 Claims, 5 Drawing Sheets

5,880,592

MODULAR DESIGN FOR AN IC TESTING BURN-IN OVEN

FIELD OF THE INVENTION

The present invention relates to integrated circuit devices, and more particularly to burn-in and test equipment used during the manufacture of integrated circuit devices.

BACKGROUND OF THE INVENTION

Operational Life Tests (OLTs) provide measures of the reliability of integrated circuit devices (ICs). An OLT achieves this by continually exercising a component such as an IC, or a plurality of components simultaneously. OLTs also include testing in a chamber having a controlled environment, with instrumentation controlled to simulate use by a customer.

During operational life testing a plurality of semiconductor devices are mounted on burn-in boards which are interconnected for operation in either series or parallel depending on the test to be performed. While the devices are being electrically tested, the temperature within the chamber is cycled to simulate temperature cycling experienced by the devices during normal use. It has been found that with operational life testing infant mortality rates can be determined, which aids in avoiding early failures in the field. Additionally, reliability problems can be dealt with by component "burn-in" which includes testing the devices at increased temperature to induce infant mortality failures at the factory.

The concept of burn-in is a method for screening out early failures in a group of devices prior to their introduction into general service by a customer. The burn-in process involves time as an important factor since the elements to be tested are monitored for failure either continuously or at a pre-defined time sequence. A goal with respect to burn-in is to provide an adequate burn-in period to detect infant mortals while not testing devices any longer than is necessary.

The controls of typical burn-in systems are interconnected with large cables from their power supplies which are difficult to connect and contribute to large, heavy equipment. Repairing the equipment can be a complex process because of the complex designs of typical testing and burn-in equipment. Typical testing equipment requires a number of power supplies to test the large number of device under test (DUT) boards loaded into the environmental chamber (oven).

SUMMARY OF THE INVENTION

A modular semiconductor component testing device comprises an environmental chamber, a circuitry chamber separated from the environmental chamber by an insulated wall, a power supply chamber, a direct current (DC) power supply in the power supply chamber for supplying a first voltage, first amperage power signal, and a power bar connected to the power supply which receives the power signal from the power supply. The testing device further comprises a zone board electrically connected to the DC power supply through the power bar and receives the power signal through the power bar. A slot board is housed in the circuitry chamber and is electrically connected to the zone board. The slot board receives the power signal from the zone board and a DC to DC power converter on the slot board lowers the first voltage to a second voltage and raises the first amperage to a second amperage. A device under test (DUT) board is housed in the environmental chamber and is connected through the insulated wall to the slot board and receives the second voltage and amperage from the slot board.

Features and advantages of the present invention will become more clear from the following detailed description of the invention, taken in conjunction with the accompanying drawings and claims, or may be learned by the practice of the invention.

Figure 1:
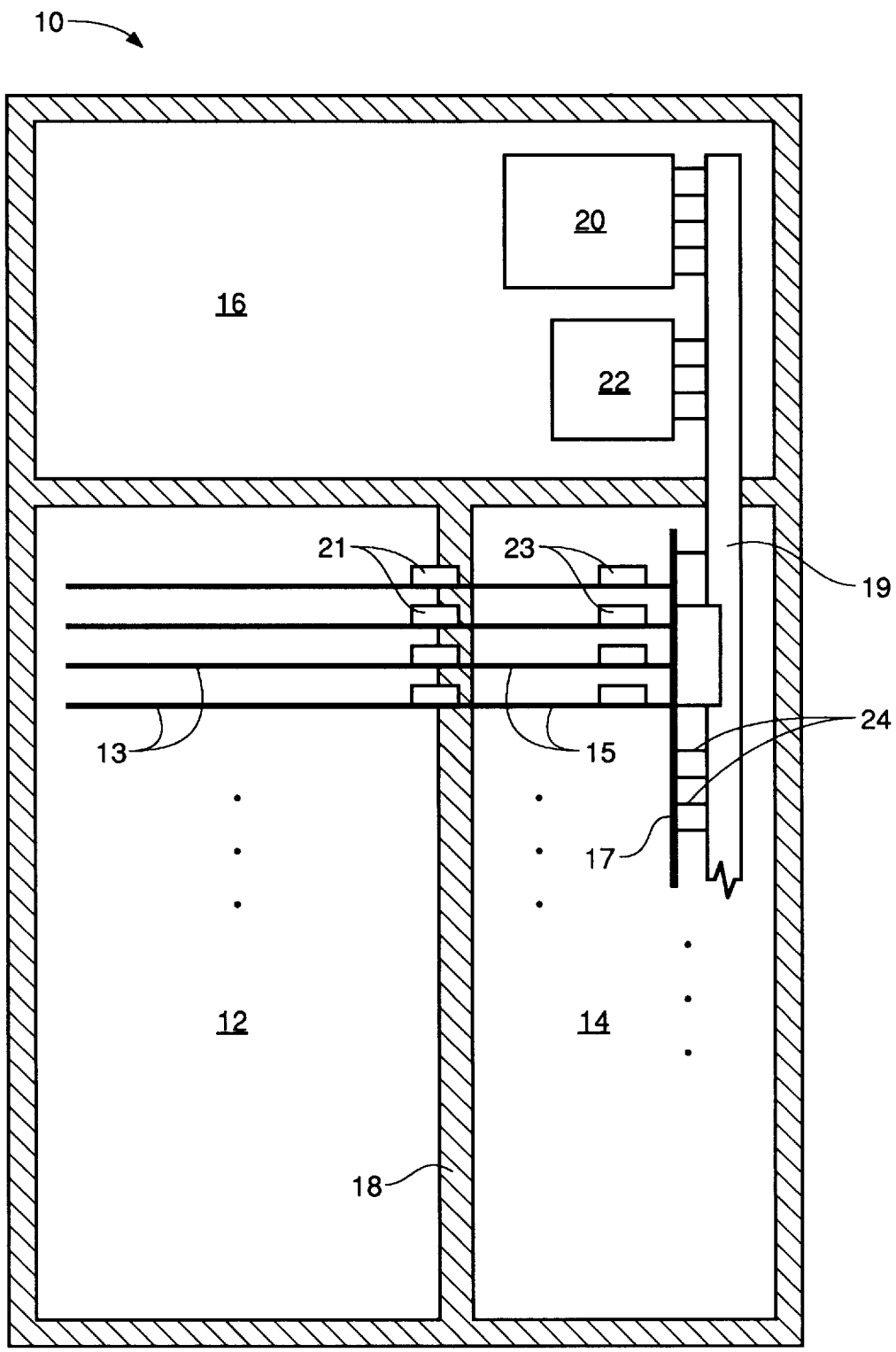
FIG. 1 is a cross section of one embodiment of the inventive testing device.

It is noted that the drawings of the invention are not to scale. The drawings are merely schematic representations and are not intended to portray specific parameters of the invention. The drawings are intended to depict only typical embodiments of the invention, and are therefore not to be considered limiting of its scope. The invention will be described with additional specificity and detail through the use of the accompanying drawings, specification, and appended claims. Additionally, like numbering in the drawings represent like elements within and between drawings.

DETAILED DESCRIPTION OF THE INVENTION

The following U.S. patents are herein incorporated by reference for pertinent and supporting information:

U.S. Pat. No. 5,086,271, is a driver system and distributed transmission line network for driving devices under test.

U.S. Pat. No. 4,900,948 is an apparatus providing signals for burn-in of integrated circuits.

U.S. Pat. No. 4,866,714, is a personal computer based dynamic burn-in system.

One skilled in IC testing will easily understand the operation of a modular design for an IC testing burn-in oven from this description and the attached drawings.

FIG. 1 comprises the following elements: A modular semiconductor component testing device 10 comprises an oven or environmental chamber 12 for cooling and/or heating components, a circuitry chamber 14, and power supply chamber 16. Device under test (DUT) boards 13 are provided in the environmental chamber during testing, and slot boards 15 are connected to the DUT boards via connectors 21 through the oven wall 18. The slot boards have direct current (DC) to DC converters 23, and are connected to the zone board 17. The zone board is connected to a power bar 19 via connectors 24 which connect the power supplies 22 and 20 to the slot, zone, and DUT boards.

Figure 2:
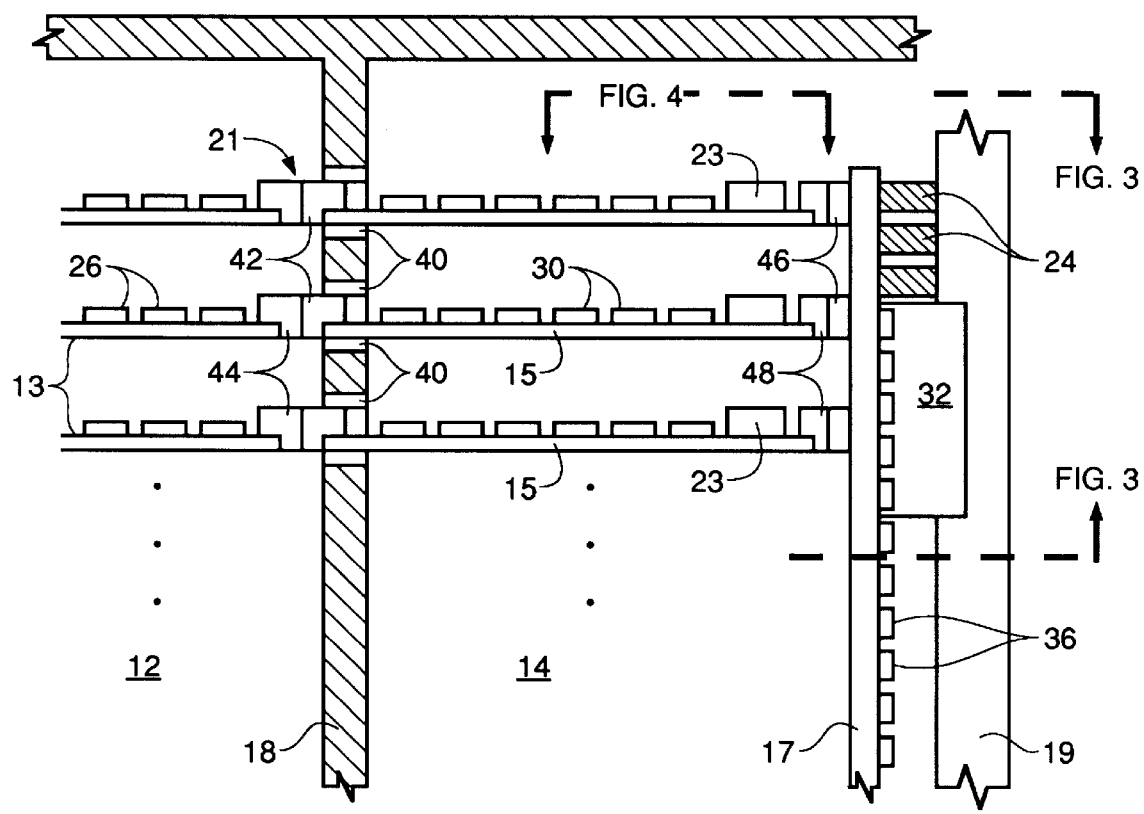
FIG. 2 is a cross section of an environmental chamber and a components chamber.

FIG. 2 contains the following elements: On DUT boards 13 are illustrated the devices under test 26. The DUT boards 13 are connected to the slot boards 15 via DUT board connector 44 and slot board connector 42, which can be any standard connector. Seals 40 act to pressure-hold the board connectors in place and seal the elevated temperature in the environmental chamber from the circuitry chamber 14. On the slot boards are illustrated control circuitry 30, a DC to DC converter 23, and slot board connector 48 joined with zone board connector 46. On the zone board is illustrated a central processing unit (CPU) card 32, and associated circuitry 36. The power bar 19 shows the connector 24 joined with the zone board 17. It is noted at this time that there are usually eight slot boards along the length of the zone board.

Figure 3:
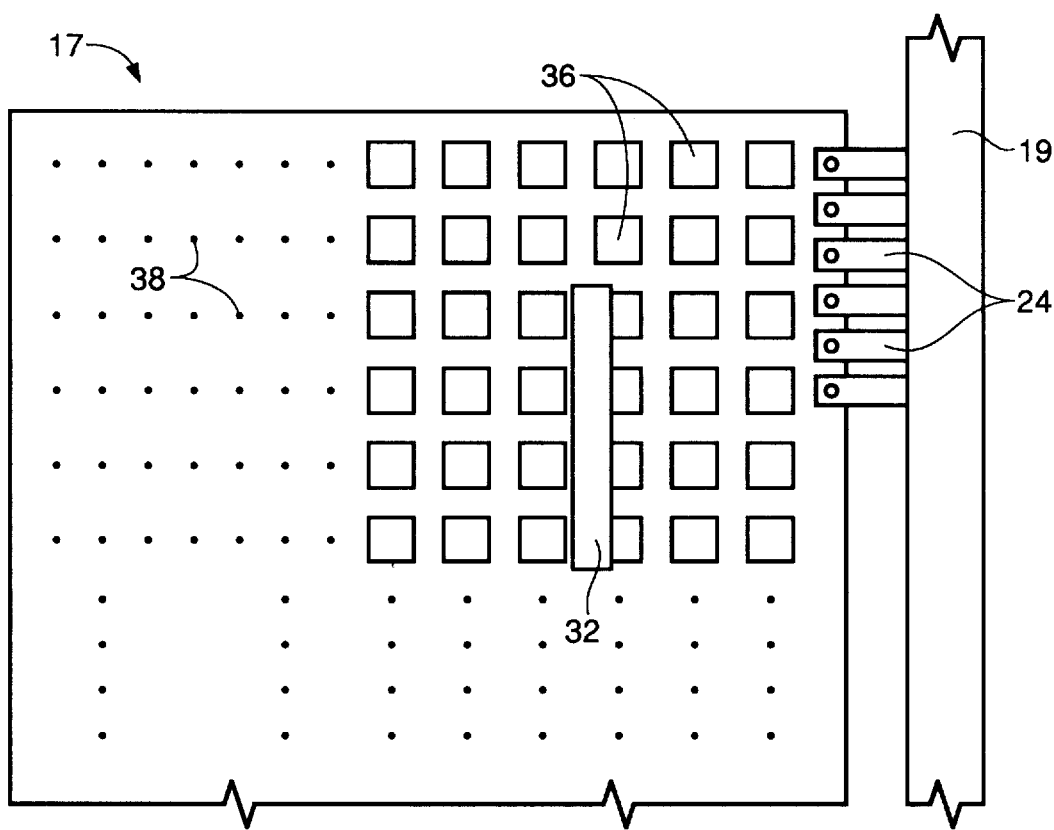
FIG. 3 is a plan view of a zone board and a power bar in one possible embodiment of the invention.

FIG. 3 comprises the following elements: Pin connections 38 from the zone board connector 46 protrude through the zone board 17.

Figure 4:
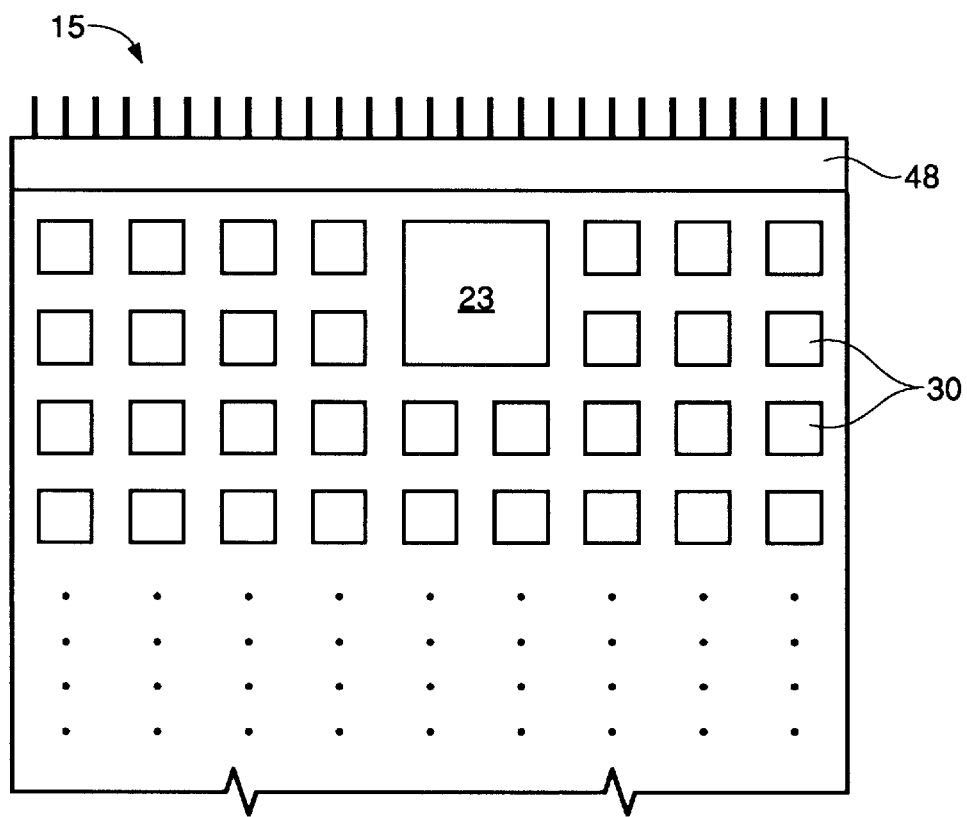
FIG. 4 is a plan view of a slot board.

FIG. 4 illustrates the arrangement of the zone board 15 comprising DC to DC converter 23, slot board connector 48, and control circuitry 30.

Figure 5:
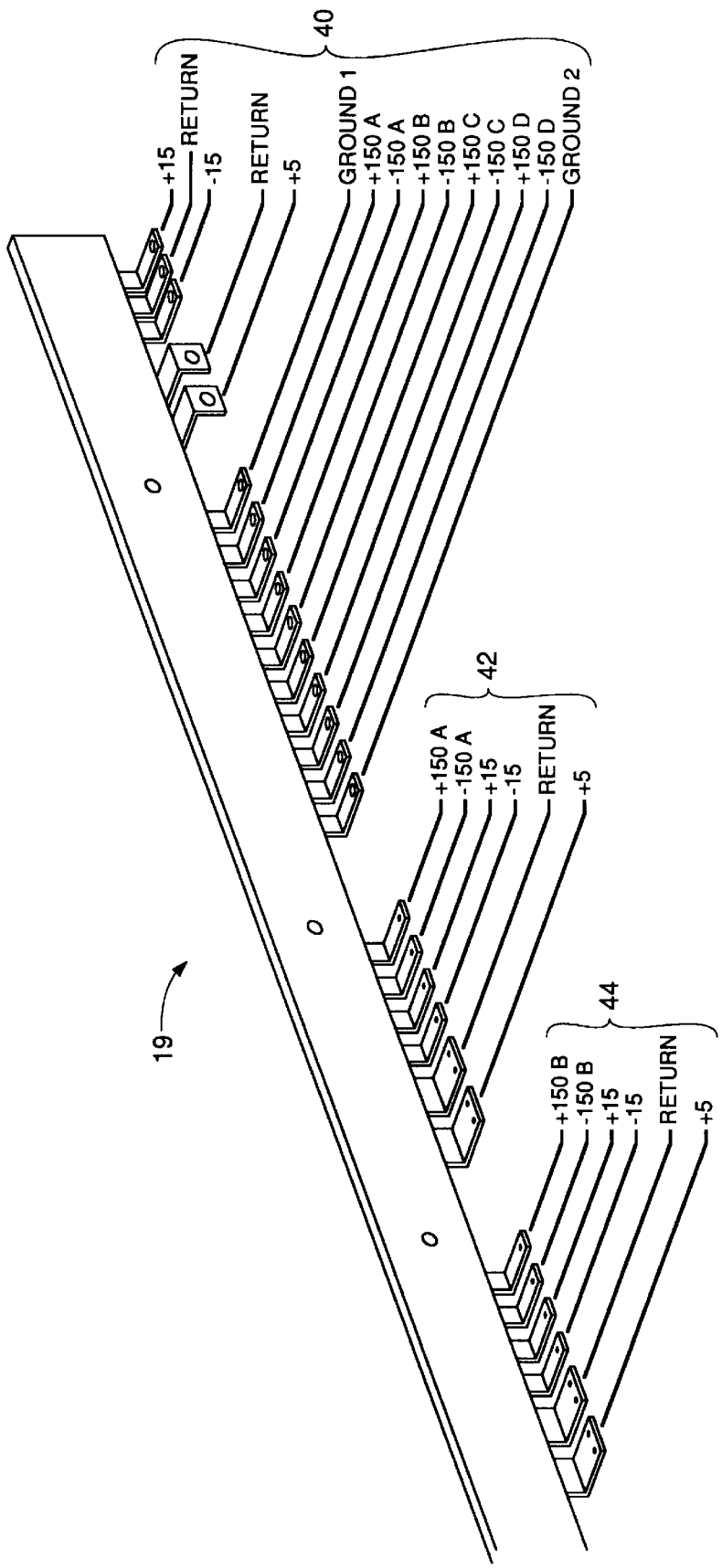
FIG. 5 illustrates a power bar and its possible connections.

FIG. 5 illustrates connector pins along the power bar 19 which interconnect the power supplies and the zone board through the power bar. In particular, element 40 comprises first fifteen pins having the signals as shown which receive the indicated signals from the power supplies 20, 22. Elements 42 and 44 each comprise a number of pins, with the pins of each element providing power to one zone with each zone having eight slot boards. Note that signals for four zones (zone A, zone B, zone C, and zone D) are shown as being received by the power supply in element 40, but signals to supply only two zones (42, 44) are shown for simplicity. The signals, while not shown, are repeated for zones C and D.

With reference to FIG. 5, starting with the upper right hand pin shown are the following pins and functions: +15 volts is received from the power supply 22 to power analog circuits on the zone 17 and slot 15 boards. RETURN is a return path for the ±15 volts, which is commonly used with the 5 volt return. The −15 volts is used to supply power for analog circuits on the zone and slot boards. RETURN is another return path as described. +5 (volts) also received from power supply 22 is used to power digital circuits on the zone and slot boards. GROUND 1 separates previous low voltage connections from high voltage connections described below. +150A and −150A are received from power supply 20 and combine to provide 300 volts for the DC to DC converter in zone A. This same arrangement is shown three additional times, once for each of zones B, C, and D. GROUND 2 separates high voltages from the outside layer of the power bar.

Element 42 supplies signals to zone A, and +150A and −150A combine to provide a 300 voltage supply. The +15 and −15 pins supply analog circuits on the zone A zone board with ±15 volts. The RETURN pin is a path for zone A +5 volts, +15 volts, and −15 volts. The +5 pin provides digital circuits on the zone A zone and slot boards with +5 volts.

The signals of element 44 provide zone B with the same signals 42 described for zone A.

The ±150 volts are routed to the DC to DC converters on each slot board. The converters lower the voltage and provide appropriate amperage for the digital circuitry, for example in the range of 5 volts and 20 amps. These power signals are then routed to the DUT boards to power the devices under test.

The remaining power supply signals, +5 volts, +15 volts, and −15 volts are used by the zone and slot boards for controlling the types of tests, for selection of the DUT board to be tested, and for storing the results of the tests. In the arrangement shown, the zone boards control the address and data information while the slot board selects the DUT board to be tested and tracks a comparison of data written to each bit location and read from each location.

It is noted that the arrangement of all of the component parts of the system is modular and convenient. If a zone board needs replacement, it is not overly difficult to disconnect the zone board from the slot board and the power bar. Similarly, it is simple to replace any slot board. It should also be noted that insertion of the DUT boards into connector 44 in preparation for burn-in and/or testing of the components is easily accomplished. In the design as shown there is very little wiring, and snap fitting and screws are used where possible.

There are several variations to the invention and thus come within the scope of the present invention. Uniquely, this invention may work with any number of slot boards attached to zone boards. Any number of zone boards may be used for testing equipment having larger chambers 12,14. Even though only one wall is illustrated as being thick to illustrate the insulation of the environmental chamber from the circuitry chamber, all walls to the oven are insulated to contain the heat in the environmental chamber. There are many types of connections that may be used and purchased over the counter to connect two printed circuit boards together other than the illustrated connectors of 42, 44, 46, and 48.

While the invention has been taught with specific reference to these embodiments, one skilled in the art will recognize that changes can be made in form and detail without departing from the spirit and the scope of the invention. The described embodiments are to be considered as illustrative and not restrictive. The scope of the invention is, therefore, indicated by the appended claims.

What is claimed is:

1. A modularly designed burn-in oven, comprising:
   an oven chamber;
   an electrical components chamber;
   an insulated wall separating said oven chamber from said components chamber;
   at least one DUT board in said oven chamber, said DUT board having first and second ends and an electrical connector at said first end;
   a slot board in said components chamber, said slot board having first and second ends, a first electrical connection on said first end, and a second electrical connection on said second end, said slot board positioned so that said first electrical connection fits through said insulated wall and couples to said electrical connector of said DUT board;
   a direct current (DC) to DC power converter on said slot board for receiving DC power from a power supply and lowering a voltage level and providing appropriate amperage for digital circuitry on said DUT board; and
   a seal positioned between said oven chamber and said components chamber so as to pressure fit said electrical connection of said slot board to said DUT board.

2. The burn-in oven of claim 1, further comprising:
   at least one zone board vertical and perpendicular to said slot board and said DUT board, said zone board having:
   an electrical coupling on a back side of said zone board for coupling to said second electrical connection of said slot board; and
   a central processing unit coupled to a front side of said zone board, and a plurality of integrated circuits on said front side.

3. The burn-in oven of claim 2, further comprising:
   a power bar parallel with said zone board;
   first and second electrical connections, said first electrical connections receiving power from a power supply and said second electrical connections providing power to said zone board, said first and second electrical connections electrically connected through said power bar.

4. The burn-in oven of claim 3, further comprising first and second sower supplies.

5. The burn-in oven of claim 4 wherein:
a) said first power supply supplies a first voltage and a first amperage;
b) said second power supply supplies a second voltage and a second amperage, said second voltage being lower than said first voltage and said second amperage being higher than said first amperage;
c) said DC to DC power converter receives said first voltage and amperage, converts said first voltage and amperage to a third voltage and amperage, said third voltage being lower than said first voltage and said third amperage being higher than said first amperage.

6. A modular semiconductor component testing apparatus, comprising:
a) an environmental chamber;
b) a circuitry chamber separated from said environmental chamber by an insulated wall;
c) a power supply chamber;
d) a direct current (DC) power supply in said power supply chamber for supplying a first voltage, first amperage power signal;
e) a power bar connected to said power supply and receiving said power signal therethrough;
f) a zone board electrically connected to said DC power supply through said power bar and receiving said power signal from said power bar;
g) a slot board housed in said circuitry chamber electrically connected to said zone board, said slot board receiving said power signal from said zone board;
h) a DC to DC power converter on said slot board for converting said power signal, said DC to DC power converter lowering said first voltage to a second voltage and raising said first amperage to a second amperage;
i) a device under test (DUT) board housed in said environmental chamber and connected through said insulated wall to said slot board and receiving said second voltage and amperage from said slot board.

7. The testing apparatus of claim 6 further comprising:
a) a first power supply for powering said device under test board;
b) a second power supply for powering circuitry on said zone board and said slot board.

8. The testing apparatus of claim 7 wherein said first power supply provides 300 volts, and said second power supply provides 15 volts and 5 volts.

9. The testing apparatus of claim 6 wherein said environmental chamber can be heated to burn-in devices on said DUT board.

10. The testing apparatus of claim 6 wherein said environmental chamber can be heated and cooled.

11. A modular semiconductor component testing apparatus, comprising:
a) a direct current (DC) power supply for providing a power signal having a first voltage and a first amperage;
b) a slot board having a connector for electrical connection with a device under test (DUT) board, said slot board receiving said power signal from said power supply;
c) a DC to DC power converter for reducing said first voltage to a second voltage and increasing said first amperage to a second amperage;
d) a DUT board for receiving a plurality of semiconductor components, said DUT board connected to said connector and receiving said second voltage and said second amperage from said DC to DC converter.

12. The apparatus of claim 11 wherein said slot board comprises said DC to DC converter.

13. The apparatus of claim 11 wherein said first voltage is 300 volts and said second voltage is 5 volts.

14. The apparatus of claim 11 wherein said power supply is a first power supply, further comprising a second power supply for powering circuitry on said slot board.

15. The apparatus of claim 14 wherein said first power supply provides a 300 volt signal and said second power supply provides a 5 volt signal.

16. A modular semiconductor component testing apparatus for testing integrated circuit devices, comprising:
a) an environmental chamber;
b) a circuitry chamber separated from said environmental chamber by an insulated wall;
c) a power supply chamber;
d) a first direct current (DC) power supply in said power supply chamber for supplying a 300 volt, low amperage power signal;
e) a second DC power supply in said power supply chamber for supplying a 15 volt power signal and a volt power signal;
f) a power bar connected to said first and second power supplies and receiving said 300, 15, and 5 volt power signals therefrom;
g) a zone board having circuitry thereon, said zone board electrically connected to said first and second DC power supplies through said power bar and receiving said power signals from said power bar, said second power supply powering said circuitry on said zone board;
h) a slot board having circuitry thereon housed in said circuitry chamber electrically connected to said zone board, said slot board receiving said power signals from said zone board, said second power supply powering said circuitry on said slot board;
i) a DC to DC power converter on said slot board for converting said 300 volt, low amperage power signal from said first power supply to a 5 volt 20 amp signal;
j) a device under test (DUT) board housed in said environmental chamber and connected through said insulated wall to said slot board and receiving said 5 volt 20 amp signal from said slot board.

* * * * *